(12) United States Patent
Li et al.

(10) Patent No.: US 11,533,045 B1
(45) Date of Patent: Dec. 20, 2022

(54) DYNAMIC AGING MONITOR AND CORRECTION FOR CRITICAL PATH DUTY CYCLE AND DELAY DEGRADATION

(71) Applicant: QUALCOMM Incorporated, San Diego, CA (US)

(72) Inventors: Xia Li, San Diego, CA (US); Min Chen, San Diego, CA (US); Jianguo Yao, Londonderry, NH (US); Bin Yang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/652,092

(22) Filed: Feb. 22, 2022

(51) Int. Cl.
| | |
|---|---|
| H03K 3/017 | (2006.01) |
| H03K 5/134 | (2014.01) |
| H03K 5/00 | (2006.01) |

(52) U.S. Cl.
CPC ............. *H03K 3/017* (2013.01); *H03K 5/134* (2014.07); *H03K 2005/00195* (2013.01)

(58) Field of Classification Search
None
See application file for complete search history.

(56) References Cited

U.S. PATENT DOCUMENTS

| | | | | |
|---|---|---|---|---|
| 6,788,120 B1 * | 9/2004 | Nguyen | ............... | H03K 5/1565 |
| | | | | 327/299 |
| 7,535,278 B1 * | 5/2009 | Ondris | ...................... | G06F 1/08 |
| | | | | 327/295 |
| 2013/0154659 A1 * | 6/2013 | Cooke | .................... | G01N 27/66 |
| | | | | 324/469 |

OTHER PUBLICATIONS

Chen, H., et al., "A 7nm 5G Mobile SoC Featuring a 3.0GHz Tri-Gear Application Processor Subsystem", 2021 IEEE International Solid-State Circuits Conference, Session 4, Processors, 4.1, Feb. 16, 2021, 3 Pages.

Wang X., et al., "Duty-Cycle Shift under Asymmetric BTI Aging: A Simple Characterization Method and its Application to SRAM Timing", 2013 IEEE International Reliability Physics Symposium (IRPS), Apr. 14-18, 2013, 5 Pages.

* cited by examiner

*Primary Examiner* — Cassandra F Cox

(74) *Attorney, Agent, or Firm* — Loza & Loza, LLP

(57) ABSTRACT

In certain aspects, a duty-cycle monitor includes a first oscillator, and a flop having a signal input, a clock input, and an output, wherein the signal input is coupled to an input of the duty-cycle monitor, and the clock input is coupled to the first oscillator. The duty-cycle monitor also includes a first counter having a count input, an enable input, and a count output, wherein the count input of the first counter is coupled to the first oscillator, and the enable input of the first counter is coupled to the output of the flop. The duty-cycle monitor also includes a second counter having a count input, an enable input, and a count output, wherein the count input of the second counter is coupled to the first oscillator, and the enable input of the second counter is coupled to the output of the flop.

24 Claims, 12 Drawing Sheets

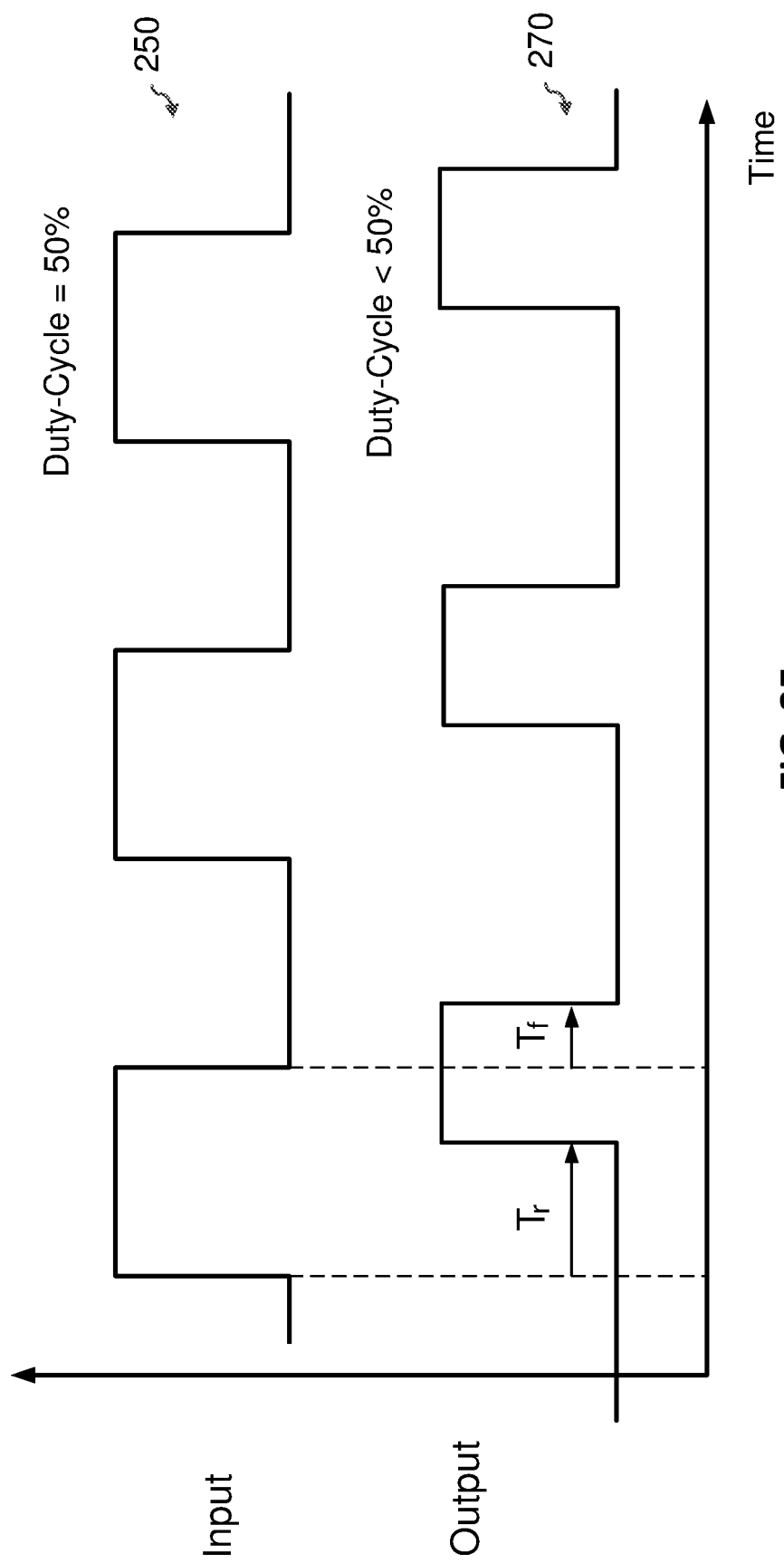

DYNAMIC AGING MONITOR AND CORRECTION FOR CRITICAL PATH DUTY CYCLE AND DELAY DEGRADATION

BACKGROUND

Field

Aspects of the present disclosure relate generally to aging, and, more particularly, to monitoring duty-cycle degradation due to aging.

Background

A system may include a clock generator (e.g., a phase-locked loop) configured to generate a clock signal for timing operations of one or more circuits (e.g., sequential logic, a processor, a memory, etc.) in the system. The system may also include a clock path for distributing the clock signal from the clock generator to the one or more circuits. A challenge facing clock distribution is that asymmetric aging in the clock path can cause duty-cycle degradation in the clock signal, which can lead to timing issues (e.g., timing violations) in the one or more circuits.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a duty-cycle monitor. The duty-cycle monitor includes a first oscillator having an output, and a flop having a signal input, a clock input, and an output, wherein the signal input is coupled to an input of the duty-cycle monitor, and the clock input is coupled to the output of the first oscillator. The duty-cycle monitor also includes a first counter having a count input, an enable input, and a count output, wherein the count input of the first counter is coupled to the output of the first oscillator, and the enable input of the first counter is coupled to the output of the flop. The duty-cycle monitor further includes a second counter having a count input, an enable input, and a count output, wherein the count input of the second counter is coupled to the output of the first oscillator, and the enable input of the second counter is coupled to the output of the flop.

A second aspect relates to a method of duty-cycle monitoring. The method includes receiving a clock signal and a reference signal, inputting the clock signal to a signal input of a flop, inputting the reference signal to a clock input of the flop, counting a number of periods of the reference signal in which an output of the flop is high to generate a first count value, and counting a number of periods of the reference signal in which the output of the flop is low to generate a second count value.

BRIEF DESCRIPTION OF THE DRAWINGS

FIG. 2E is a timing diagram illustrating another example of a duty-cycle shift in the clock path due to asymmetric aging according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
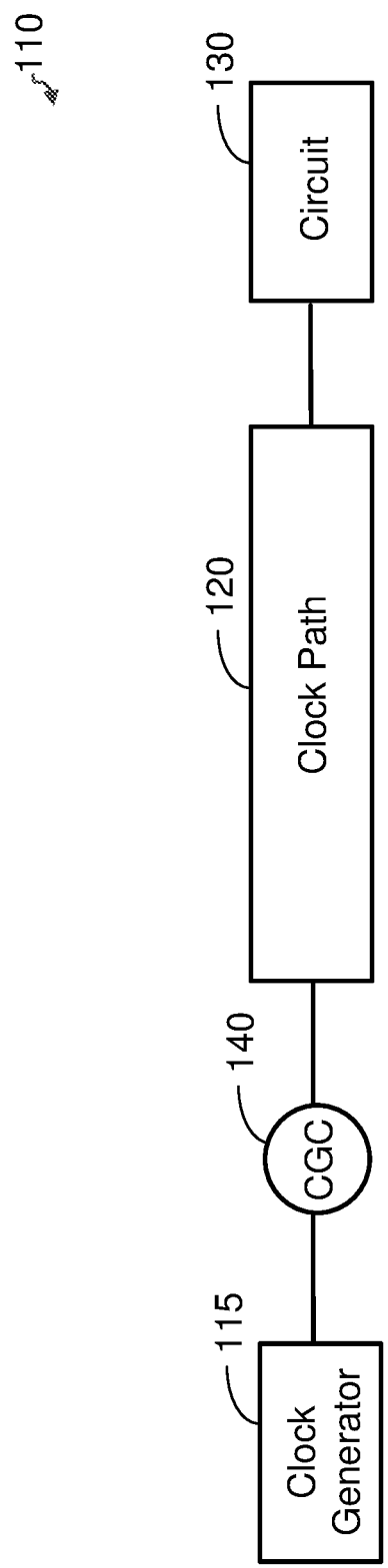
FIG. 1 shows an example of a system including a clock generator, a clock path, and a circuit according to certain aspects of the present disclosure.

FIG. 1 shows an example of a system 110 including a clock generator 115, a clock path 120, and a circuit 130 according to certain aspects. The clock generator 115 is configured to generate a clock signal for timing operations of the circuit 130. The circuit 130 may include sequential logic, a processor, a memory, etc. The clock generator 115 may be implemented with a phase-locked loop (PLL) or another type of clock generator. The clock path 120 is configured to distribute the clock signal from the clock generator 115 to the circuit 130. As used herein, a "clock signal" may be a periodic signal that oscillates between high and low. The clock signal has a duty cycle, which may be expressed as a percentage or a fraction of a clock period (i.e., clock cycle) in which the clock signal is high (i.e., one).

In certain aspects, the system 110 includes a clock gating circuit 140 configured to gate the clock signal to save power when the circuit 130 is not active (e.g., in an idle mode), and pass the clock signal when the circuit 130 is active. Clock gating is a known technique for reducing dynamic power consumption when a circuit is not active. Although one clock gating circuit 140 is shown between the clock generator 115 and the clock path 120 in FIG. 1, it is to be appreciated that the system 110 may include two or more clock gating circuits (e.g., at different locations along the clock path 120). It is also to be appreciated that the clock path 120 may include multiple branches (not shown) forming a clock tree to distribute the clock signal to multiple circuits including the circuit 130.

Aging effects such as bias temperature instability (BTI) can degrade the performance of the clock path 120 over time. For example, BTI stress in the clock path during idle mode can cause a duty-cycle shift in the clock path over time, which can lead to timing issues (e.g., timing violations) in the circuit 130.

Figure 2A:
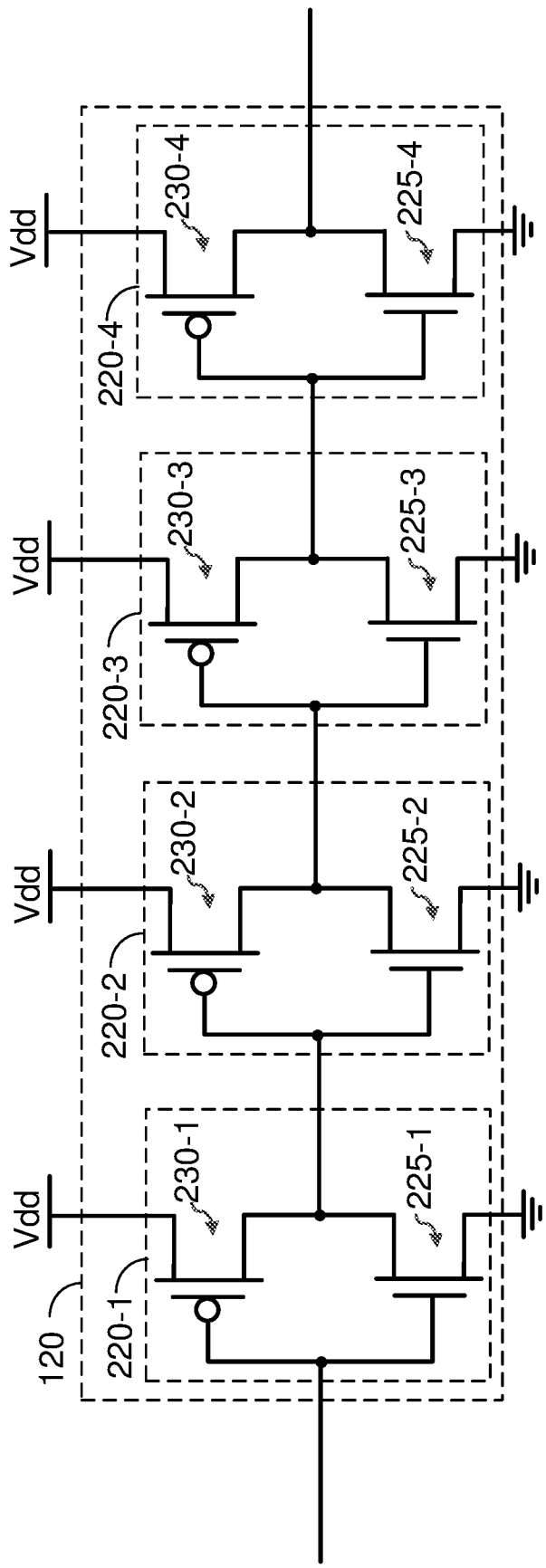
FIG. 2A shows an example of the clock path including clock buffers according to certain aspects of the present disclosure.

An example of duty-cycle shift caused by aging will now be discussed with reference to FIGS. 2A to 2E. FIG. 2A shows an example in which the clock path 120 includes clock buffers 220-1 to 220-4 coupled in series. Although four clock buffers 220-1 to 220-4 are shown in FIG. 2A for simplicity, it is to be appreciated that the clock path 120 may include a large number of clock buffers. In the example shown in FIG. 2A, each of the clock buffers 220-1 to 220-4 is implemented with a respective complementary inverter including a respective one of transistors 225-1 to 225-4 (e.g., n-type field effect transistor) and a respective one of transistors 230-1 to 230-4 (e.g., p-type field effect transistor). However, it is to be appreciated that each of the clock buffers 220-1 to 220-4 may be implemented with another type of circuit or logic gate.

When the circuit 130 is in an active mode, the clock path 120 receives the clock signal and the clock signal propagates through the clock buffers 220-1 to 220-4 to the circuit 130. When the circuit 130 is in an idle mode, the clock gating circuit 140 may park (i.e., hold) the input of the clock path 120 high or low for an idle period.

Figure 2B:
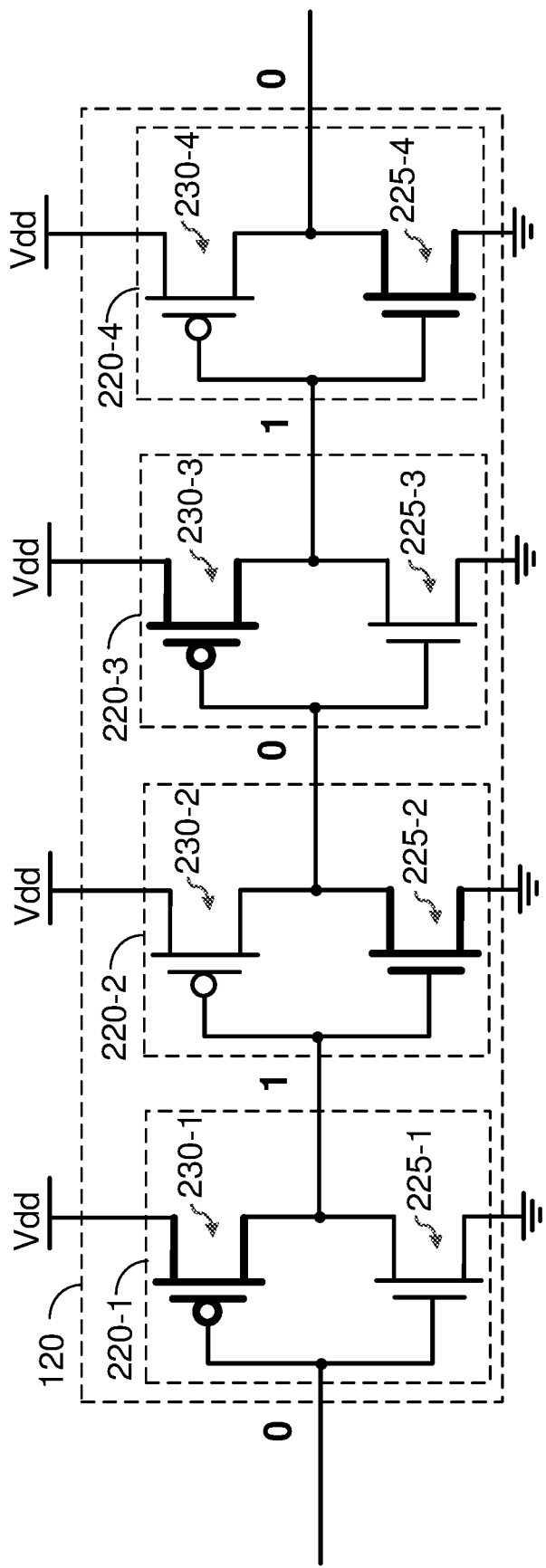
FIG. 2B shows an example in which an input of the clock path is parked low in an idle mode according to certain aspects of the present disclosure.

FIG. 2B shows an example in which the input of the clock path 120 is parked low (i.e., logic zero) in the idle mode. FIG. 2B also shows the logic states at the input and the output of each of the clock buffers 220-1 to 220-4. In this example, the output of the clock path 120 is low (i.e., logic zero) in the idle mode. In this example, transistors 230-1, 225-2, 230-3, and 225-4 are turned on in the idle mode and transistors 225-1, 230-2, 225-3, and 230-4 are turned off in the idle mode. In FIG. 2B, the transistors 230-1, 225-2, 230-3, and 225-4 that are turned on in the idle mode are shown with thickened lines. The transistors 230-1, 225-2, 230-3, and 225-4 that are turned on in the idle mode are stressed in the idle mode while the transistors 225-1, 230-2, 225-3, and 230-4 that are turned off in the idle mode are not stressed in the idle mode. This leads to asymmetric aging in which the transistors 230-1, 225-2, 230-3, and 225-4 that are stressed in the idle mode age faster than the transistors 225-1, 230-2, 225-3, and 230-4 that are not stressed in the idle mode.

Figure 2C:
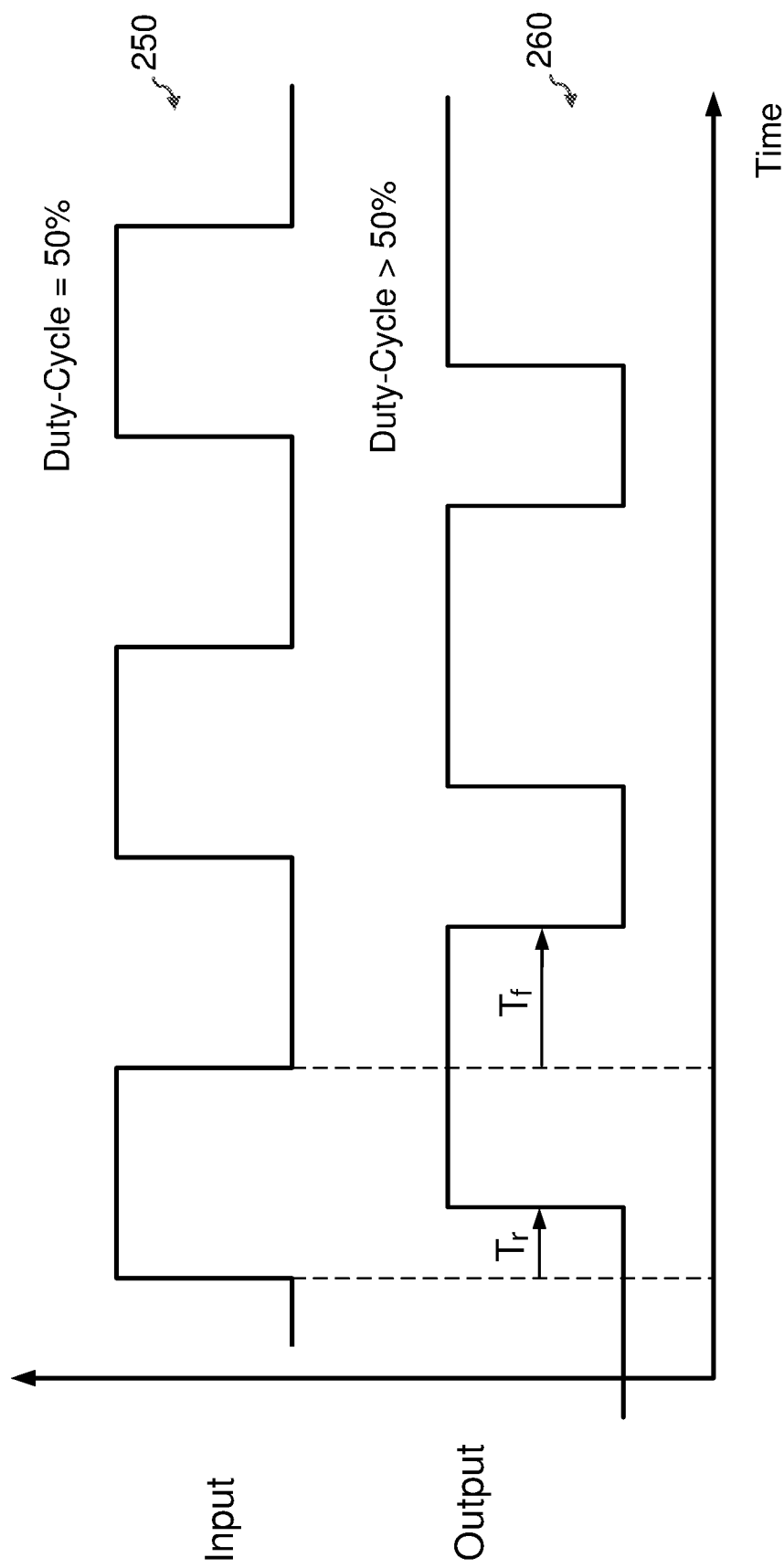
FIG. 2C is a timing diagram illustrating an example of a duty-cycle shift in the clock path due to asymmetric aging according to certain aspects of the present disclosure.

In this example, the asymmetric aging shifts the threshold voltages of the transistors 230-1, 225-2, 230-3, and 225-4 that are stressed in the idle mode, causing the falling edge delay at the output of the clock path 120 to increase relative to the rising edge delay at the output of the clock path 120. The increase in the falling edge delay relative to the rising edge delay causes a duty-cycle shift in the clock path 120. An example of the duty-cycle shift is illustrated in a timing diagram shown in FIG. 2C. In the example shown in FIG. 2C, a clock signal 250 having a duty cycle of 50% is input to the clock path 120 in the active mode. FIG. 2C also shows the clock signal 260 at the output of the clock path 120 after propagating through the clock path 120. The clock path 120 delays a rising edge of the clock signal 250 by delay $T_r$ and delays a falling edge of the clock signal 250 by delay $T_f$. As shown in FIG. 2C, the delay $T_f$ of the falling edge is longer than the delay $T_r$ of the rising edge due to the asymmetric aging. In this example, the longer delay of the falling edge causes the duty cycle of the clock signal 260 at the output of the clock path 120 to increase (i.e., results in a duty cycle greater than 50%).

Figure 2D:
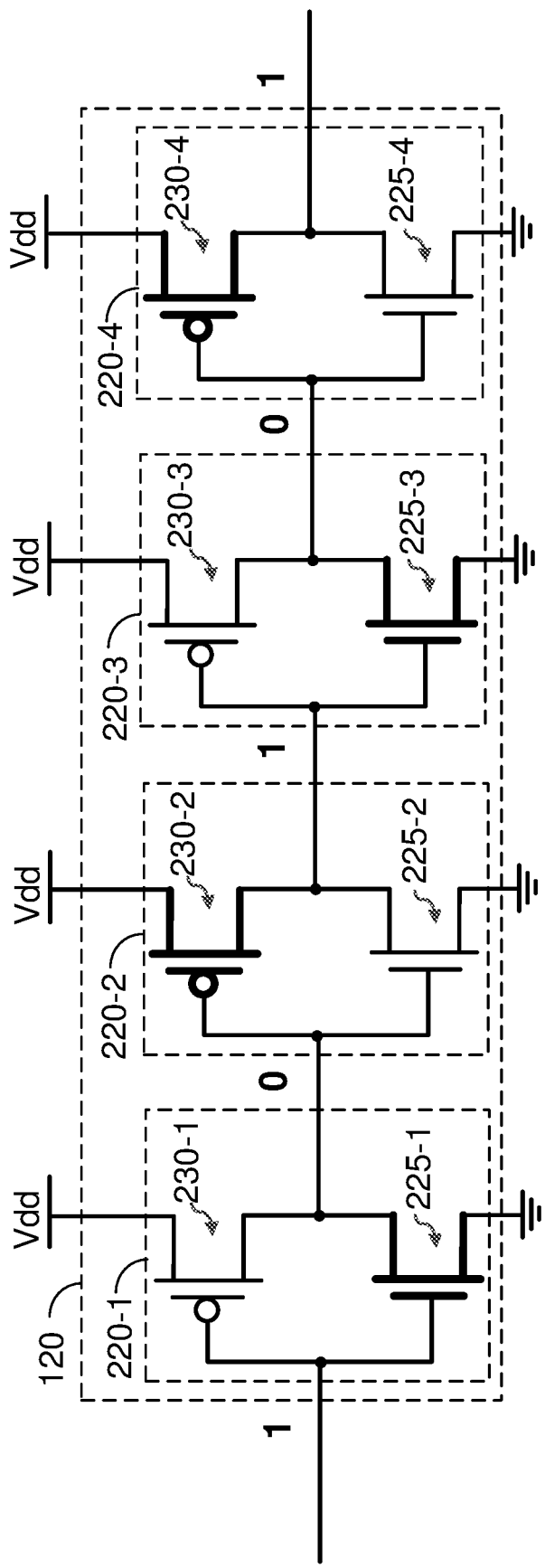
FIG. 2D shows an example in which the input of the clock path is parked high in the idle mode according to certain aspects of the present disclosure.

In the example illustrated in FIGS. 2B and 2C, the input of the clock path 120 is parked low in the idle mode. Asymmetric aging also occurs for the case where the input of the clock path 120 is parked high in the idle mode. In this regard, FIG. 2D shows an example in which the input of the clock path is parked high (i.e., logic one) in the idle mode. FIG. 2D also shows the logic states at the input and the output of each the clock buffers 220-1 to 220-4. In this example, the output of the clock path 120 is high (i.e., logic one) in the idle mode. In this example, transistors 225-1, 230-2, 225-3, and 230-4 are turned on in the idle mode and transistors 230-1, 225-2, 230-3, and 225-4 are turned off in the idle mode. In FIG. 2D, the transistors 225-1, 230-2, 225-3, and 230-4 that are turned on in the idle mode are shown with thickened lines. The transistors 225-1, 230-2, 225-3, and 230-4 that are turned on in the idle mode are stressed in the idle mode while the transistors 230-1, 225-2, 230-3, and 225-4 that are turned off in the idle mode are not stressed in the idle mode, which leads to asymmetric aging in which the transistors 225-1, 230-2, 225-3, and 230-4 that are stressed in the idle mode age faster than the transistors 230-1, 225-2, 230-3, and 225-4.

In this example, the asymmetric aging shifts the threshold voltages of the transistors 225-1, 230-2, 225-3, and 230-4 that are stressed in the idle mode, causing the rising edge delay at the output of the clock path 120 to increase relative to the falling edge delay at the output of the clock path 120. The increase in the rising edge delay relative to the falling edge delay causes a duty-cycle shift in the clock path 120. An example of the duty-cycle shift is illustrated in the timing diagram shown in FIG. 2E. In the example shown in FIG. 2E, the clock signal 250 having the duty cycle of 50% is input to the clock path 120 in the active mode. FIG. 2E also shows the clock signal 270 at the output of the clock path 120 after propagating through the clock path 120. The clock path 120 delays a rising edge of the clock signal 250 by delay $T_r$ and delays a falling edge of the clock signal 250 by delay $T_f$ at the output of the clock path 120. As shown in FIG. 2E, the delay $T_r$ of the rising edge is longer than the delay $T_f$ of the falling edge due to the asymmetric aging. In this example, the longer delay of the rising edge causes the duty cycle of the clock signal 270 at the output of the clock signal to decrease (i.e., results in a duty cycle less than 50%).

Thus, asymmetric aging in the idle mode causes a duty-cycle shift (i.e., duty-cycle degradation) over time. The duty-cycle shift increases or decreases the duty cycle depending, for example, on whether the input of the clock path 120 is parked low or high in the idle mode, and/or the number of clock buffers in the clock path 120. The duty-cycle shift can lead to timing issues in the circuit 130. For the example where the circuit 130 includes sequential logic, the duty-cycle shift can result in setup time and/or hold time violations.

Figure 3:
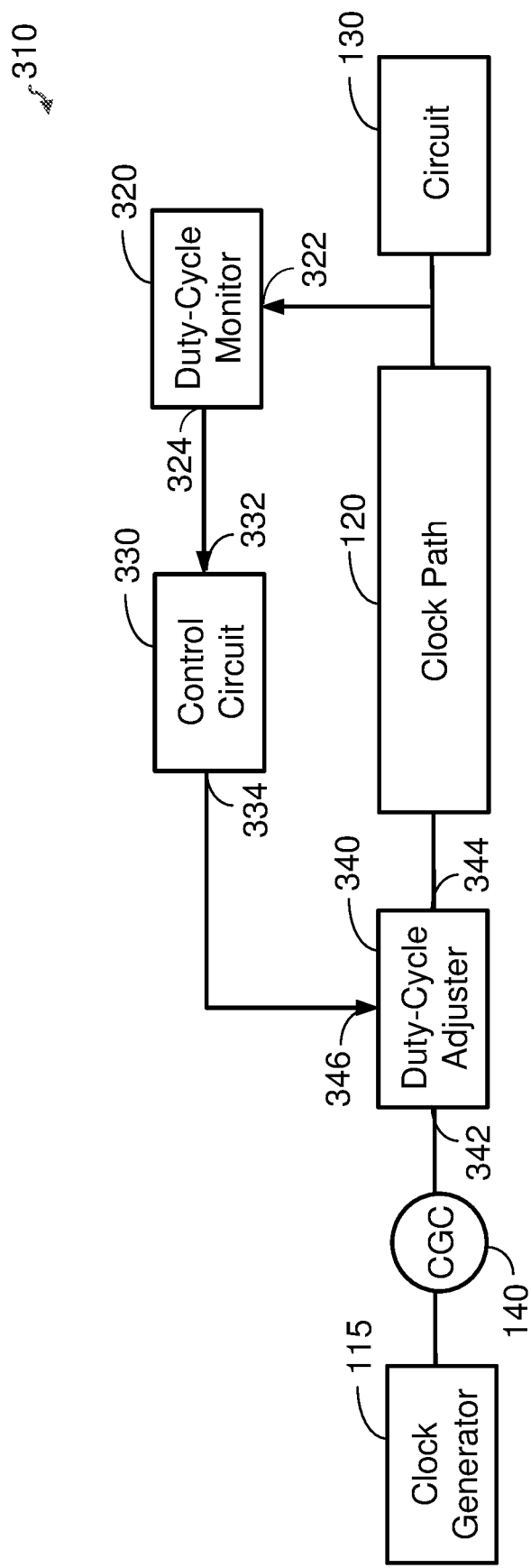
FIG. 3 shows an example of a system with duty-cycle correction according to certain aspects of the present disclosure.

To address duty-cycle shift (i.e., degradation) due to asymmetric aging, a system may employ duty-cycle correction. In this regard, FIG. 3 shows an example of a system 310 with duty-cycle correction according to certain aspects. In this example, the system 310 includes the clock generator 115, the clock path 120, the circuit 130, and the clock gating circuit 140 discussed above. For duty-cycle correction, the system 310 also includes a duty-cycle monitor 320, a control circuit 330, and a duty-cycle adjuster 340.

The duty-cycle monitor 320 has an input 322 and an output 324. In the example in FIG. 3, the input 322 of the duty-cycle monitor 320 is coupled to the output of the clock path 120. The duty-cycle monitor 320 is configured to receive the clock signal at the input 322, measure one or more parameters of the clock signal related to the duty cycle of the clock signal, and output a measurement signal indicating the one or more measured parameters at the output 324. Examples of the measured parameters are provided below according to certain aspects. The duty-cycle monitor 320 may also be referred to as a duty-cycle detector, a duty-cycle measurement circuit, or another term.

The duty-cycle adjuster 340 has a clock input 342, a control input 346, and a clock output 344. The clock input 342 is coupled to the clock generator 115 (e.g., via the clock gating circuit 140 in the active mode) and the clock output 344 is coupled to the input of the clock path 120. The duty-cycle adjuster 340 is configured to receive the clock signal at the clock input 342, and receive a control signal at the control input 346. The control signal is provided by the control circuit 330, as discussed further below. The duty-cycle adjuster 340 is configured to adjust the duty cycle of the clock signal based on the control signal, and output the duty-cycle adjusted clock signal at the output 344. The duty-cycle adjuster 340 may also be referred to as clock shaper, a duty-cycle shifter, or another term.

The control circuit 330 has an input 332 and an output 334. The input 332 of the control circuit 330 is coupled to the output 324 of the duty-cycle monitor 320, and the output 334 of the control circuit 330 is coupled to the control input 346 of the duty-cycle adjuster 340. The control circuit 330 is configured to receive a measurement signal indicating one or more measured parameters from the duty-cycle monitor 320 via the input 332. As discussed above, the one or more measured parameters are related to the duty cycle of the clock signal at the output of the clock path 120, and therefore provide the control circuit 330 with information on the duty cycle of the clock signal at the output of the clock path 120.

The control circuit 330 is configured to determine a duty-cycle correction for the clock signal based on the one or more measured parameters, and generate a control signal based on the determined duty-cycle correction. The control circuit 330 outputs the generated control signal to the control input 346 of the duty-cycle adjuster 340, which adjusts the duty cycle of the clock signal based on the control signal. The control signal causes the duty-cycle adjuster 340 to adjusts (i.e., shift) the duty cycle of the clock signal in a direction that compensates for the duty-cycle shift caused by the clock path 120.

Thus, in this example, the duty-cycle monitor 320 monitors the duty cycle of the clock signal at the output of the clock path 120, and the control circuit 330 causes the duty-cycle adjuster 340 to adjust the duty cycle of the clock signal based on the monitored duty cycle to correct for the duty-cycle shift caused by the clock path 120. In certain aspects, the duty-cycle correction may be performed each time the system 310 is booted.

Various circuits have been developed to implement the duty-cycle monitor 320. In one approach, the duty-cycle monitor 320 uses beat-frequency detection to calculate the duty-cycle shift of the clock signal due to aging (also referred to as stress) in the clock path 120. In this approach, the duty-cycle monitor 320 includes a reference oscillator that generates a reference signal having a frequency of $F_{ref}$. The duty-cycle monitor 320 counts a number of periods of the reference signal in one beat period using a counter to generate a count value. One beat period is equal to $1/F_{beat}$ where $F_{beat}$ is the difference between the frequency of the reference signal (i.e., $F_{ref}$) and the frequency of the clock signal. To determine the shift in the duty cycle of the clock signal due to aging, the duty-cycle monitor 320 generates a count value before aging and a count value after aging. The control circuit 330 then calculates the shift in the duty cycle based on the count value before aging, the count value after aging, the frequency of the clock signal, and the propagation delay of the clock path 120 before aging.

However, this approach suffers from several drawbacks. First, this approach requires a memory (e.g., Efuse memory) to record the count value before aging. Also, this approach requires that the frequency of the clock signal be known to calculate the shift in the duty cycle. The frequency of the clock signal may not be accurately known and/or vary across process corners, which negatively impacts the ability of the control circuit 330 to accurately calculate the shift in the duty cycle of the clock signal.

Figure 4A:
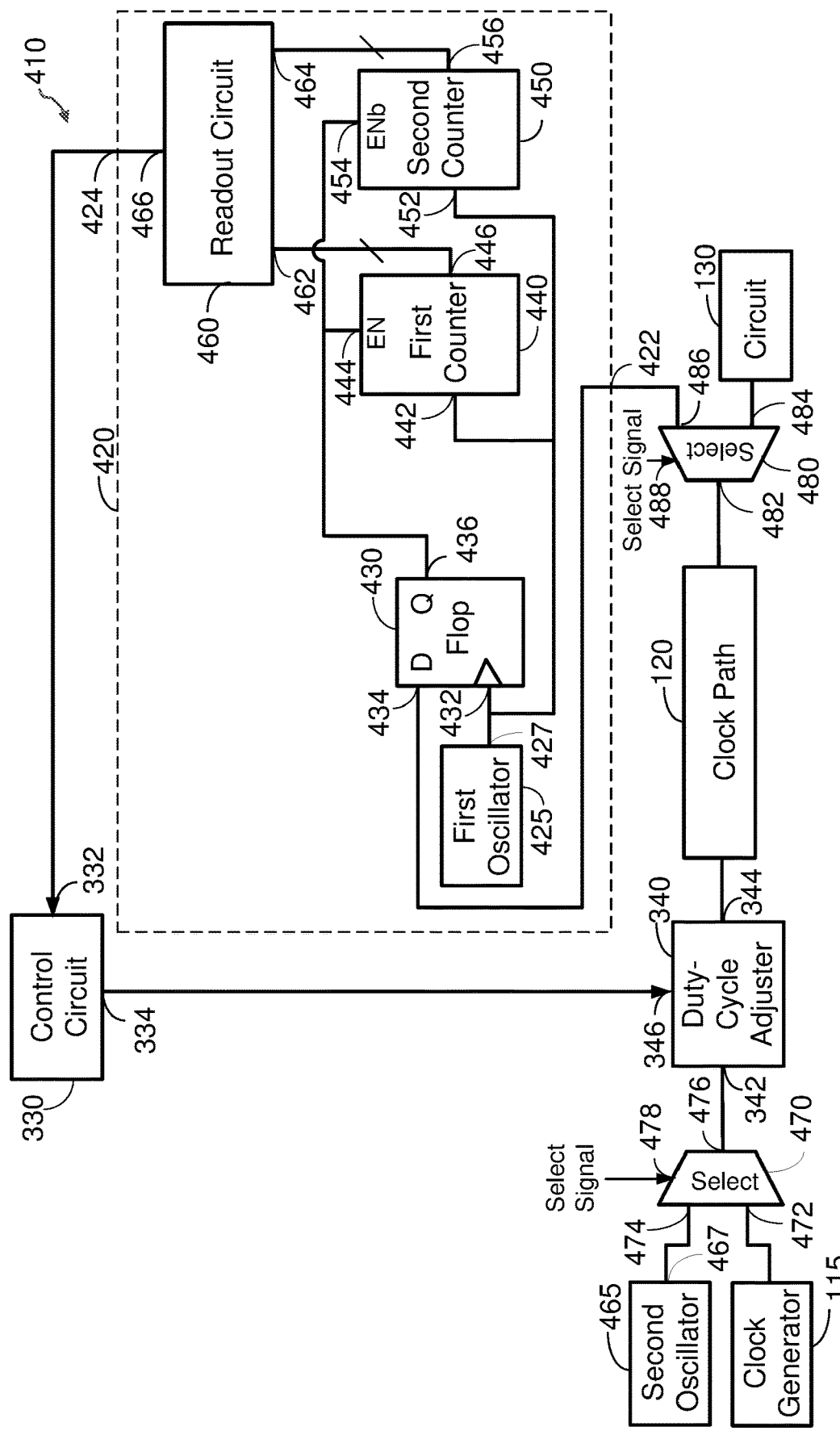
FIG. 4A shows an example of a duty-cycle monitor according to certain aspects of the present disclosure.

FIG. 4A shows an example of a system 410 including an exemplary duty-cycle monitor 420 that overcomes one or more of the drawbacks of the duty-cycle monitor 320 discussed above according to certain aspects. The duty-cycle monitor 420 has an input 422 and an output 424. In the example shown in FIG. 4A, the duty-cycle monitor 420 includes a first oscillator 425, a flop 430 (e.g., D flip-flop), a first counter 440, a second counter 450, and a readout circuit 460. The first oscillator 425 is configured to generate a reference signal that oscillates at a reference frequency $F_{ref}$, and output the reference signal at the output 427 of the first oscillator 425. In this regard, the first oscillator 425 may also be referred to as a reference oscillator. The duty-cycle monitor 420 is discussed further below according to certain aspects.

In this example, the system 410 also includes the clock path 120, the duty-cycle adjuster 340, the control circuit 330, the circuit 130, and the clock generator 115 discussed above. The system 410 further includes a first select circuit 470, a second select circuit 480, and a second oscillator 465. The second oscillator 465 is configured to generate a test clock signal having a frequency that is close to the reference frequency $F_{ref}$, and output the test clock signal at the output 467 of the second oscillator 465. For example, the frequency of the test clock signal may be within 5% of the reference frequency $F_{ref}$ (i.e., between 0.95 $F_{ref}$ and 1.05 $F_{ref}$). As discussed further below, making the frequency of the test clock signal close to the reference frequency enhances the resolution of the duty-cycle monitor 420. Each of the first oscillator 425 and the second oscillator 465 may be implemented with a respective ring oscillator or another type of oscillator.

The first select circuit 470 has a first input 472 coupled to the clock generator 115, a second input 474 coupled to the output 467 of the second oscillator 465, an output 476 coupled to the input 342 of the duty-cycle adjuster 340, and a select input 478. The first select circuit 470 is configured to receive a select signal at the select input 478, select the first input 472 or the second input 474 based on the select signal, and couple the selected one of the first input 472 and the second input 474 to the output 476. The select signal may be come from the control circuit 330 or another control circuit. The first select circuit 470 may be implemented with a multiplexer.

The second select circuit 480 has an input 482 coupled to the clock path 120, a first output 484 coupled to the circuit 130, a second output 486 coupled to the input 422 of the duty-cycle monitor 420, and a select input 488. In this example, the clock path 120 is coupled between the output 344 of the duty-cycle adjuster 340 and the input 482 of the second select circuit 480. The second select circuit 480 is configured to receive a select signal at the select input 478, select the first output 484 or the second output 486 based on the select signal, and couple the input 482 to the selected one of the first output 484 and the second output 486.

In the example in FIG. 4A, the input 332 of the control circuit 330 is coupled to the output 424 of the duty-cycle monitor 420. The output 334 of the control circuit 330 is coupled to the control input 346 of the duty-cycle adjuster 340 as discussed above with reference to FIG. 3. Although not explicitly shown in FIG. 4A, the control circuit 330 may be coupled to the select inputs 478 and 488 of the select circuits 470 and 480 to control the selections of the select circuits 470 and 480.

The select circuits 470 and 480 allow the system 410 to switch between a mission mode and a test mode according to certain aspects. In the mission mode, the control circuit 330 causes the first select circuit 470 to select the first input 472 and causes the second select circuit 480 to select the first output 484. As a result, the first select circuit 470 couples the clock generator 115 to the duty-cycle adjuster 340, and the second select circuit 480 couples the clock path 120 to the circuit 130. This allows the clock signal generated by the clock generator 115 (e.g., PLL) to propagate to the circuit 130 via the duty-cycle adjuster 340 and the clock path 120. As discussed above, the duty-cycle adjuster 340 may adjust the duty cycle of the clock signal to correct for a duty-cycle shift in the clock path 120 due to aging. As discussed further below, the duty-cycle adjustment for correcting the duty-cycle shift is determined in the test mode. The test mode and the mission mode may also be referred to as a first mode and a second mode, respectively.

Although not explicitly shown in FIG. 4A, it is to be appreciated that the system 410 may include one or more clock gating circuits (e.g., clock gating circuit 140) at one or more locations between the clock generator 115 and the circuit 130 to gate the clock signal when the circuit 130 not active. When the circuit is active, the one or more clock gating circuits pass the clock signal from the clock generator 115 to the circuit 130.

In the test mode, the control circuit 330 causes the first select circuit 470 to select the second input 474 and causes the second select circuit 480 to select the second output 486. As a result, the first select circuit 470 couples the output 467 of the second oscillator 465 to the duty-cycle adjuster 340, and the second select circuit 480 couples the clock path 120 to the input 422 of the duty-cycle monitor 420. This allows the test clock signal generated by the second oscillator 465 to propagate to the input 422 of the duty-cycle monitor 420 via the duty-cycle adjuster 340 and the clock path 120. Since the test clock signal propagates though the clock path 120 to reach the duty-cycle monitor 420, the duty cycle of the test clock signal is shifted by the clock path 120. This allows the control circuit 330 to determine the duty-cycle shift caused by the clock path 120 based measurements of the test clock signal by the duty-cycle monitor 420, as discussed further below. For the example where the system 410 includes the one or more clock gating circuits (not shown), the one or more clock gating circuits may pass the test clock signal in the test mode.

The duty-cycle monitor 420 will now be discussed according to certain aspects. In the example in FIG. 4A, the flop 430 has a signal input 434 (labeled "D"), a clock input 432, and an output (labeled "Q"). The signal input 434 may also be referred to as a D input or another term. The signal input 434 is coupled to the input 422 of the duty-cycle monitor 420 and therefore receives the test clock signal in the test mode. The clock input 432 is coupled to the output 427 of the first oscillator 425 and therefore receives the reference signal from the first oscillator 425.

In certain aspects, the flop 430 is configured to latch the logic state of the test clock signal at the signal input 434 on each rising edge of the reference signal (for a positive-edge-triggered implementation of the flop 430) or each falling edge of the reference signal (for a negative-edge-triggered implementation of the flop 430), and output the latched logic state at the output 436. This causes the flop 430 to output a signal at the output 436 having a frequency that is approximately equal to the difference between the frequency of the reference signal and the frequency of the test clock signal. In certain aspects, the frequency of the test clock signal is close to the frequency of the reference signal (e.g., within 5% of the frequency of the reference signal). As discussed further below, making frequency of the test clock signal close to the frequency of the reference signal increases the resolution of the duty-cycle monitor 420. The output signal of the flop 430 is used to measure the duty cycle of the test clock signal, as discussed further below.

In the example in FIG. 4A, the first counter 440 has a count input 442, a count output 446, and an enable input 444. The count input 442 is coupled to the output 427 of the first oscillator 425 and therefore receives the reference signal from the first oscillator 425. The enable input 444 is coupled to the output 436 of the flop 430 and therefore receives the output signal of the flop 430. The count output 446 is coupled to a first input 462 of the readout circuit 460. In certain aspects, the first counter 440 is configured to count periods of the reference signal when the output signal at the enable input 444 is high (i.e., logic one) to generate a count value, and output the count value at the count output 446. For example, the first counter 440 may increment the count value on each rising edge of the reference clock signal while the enable input 444 is high (i.e., logic one). As discussed further below, the count value from the first counter 440 is used to measure the high phase of the test clock signal, in which the high phase is the time duration in which the test clock signal is high during each period of the test clock signal.

In the example in FIG. 4A, the second counter 450 has a count input 452, a count output 456, and an enable input 454. The count input 452 is coupled to the output 427 of the first oscillator 425 and therefore receives the reference signal from the first oscillator 425. The enable input 454 is coupled to the output 436 of the flop 430 and therefore receives the output signal of the flop 430. The count output 456 is coupled to a second input 464 of the readout circuit 460. In certain aspects, the second counter 450 is configured to count periods of the reference signal when the output signal at the enable input 454 is low (i.e., logic zero) to generate a count value, and output the count value at the count output 456. For example, the second counter 450 may increment the count value on each rising edge of the reference clock signal while the enable input 454 is low (i.e., logic low). As discussed further below, the count value from the second counter 450 is used to measure the low phase of the test clock signal, in which the low phase is the time duration in which the test clock signal is low during each period of the test clock signal. An alternative implementation of the second counter 450 is discussed below with reference to FIG. 4B.

Figure 5:
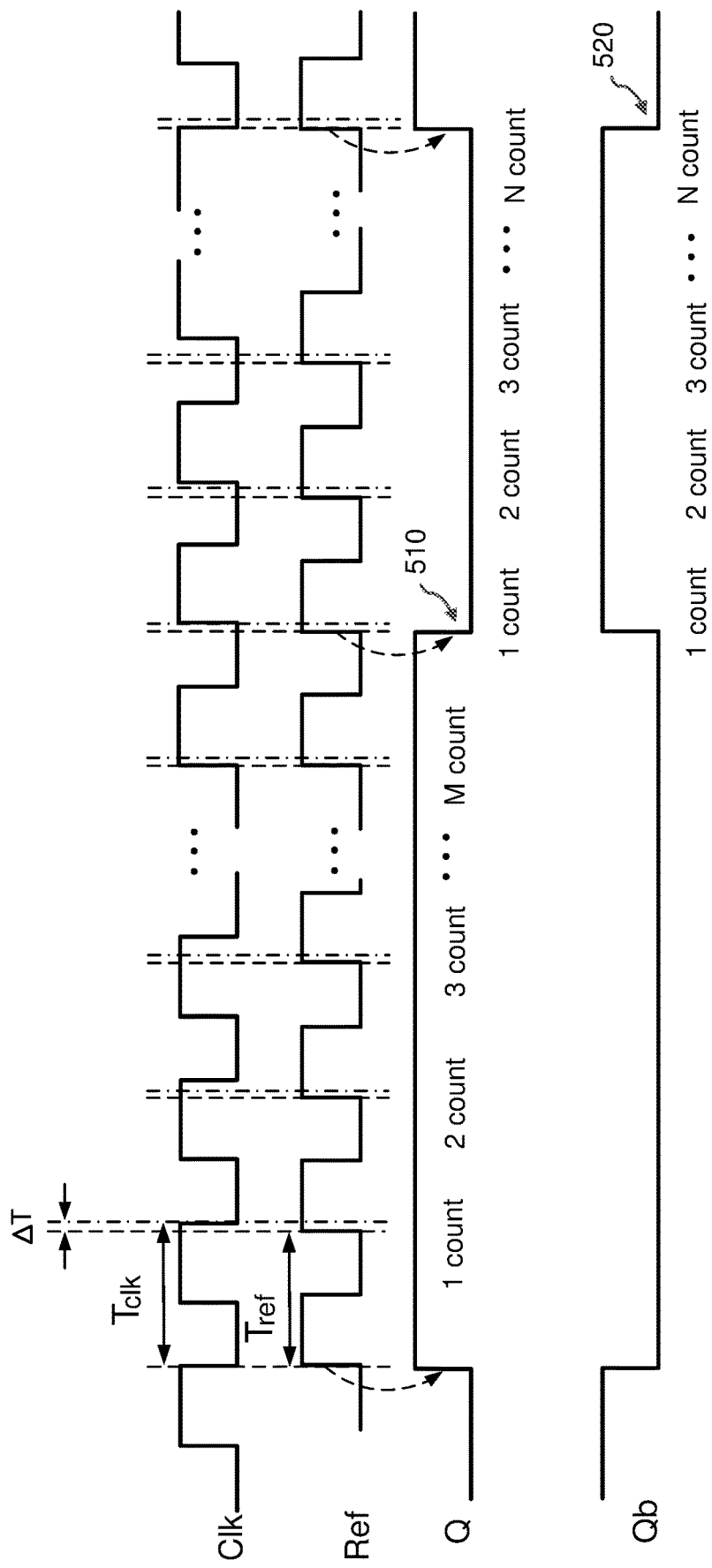
FIG. 5 is a timing diagram illustrating exemplary operations of the duty-cycle monitor according to certain aspects of the present disclosure.

Exemplary operations of the duty-cycle monitor 420 will now be discussed with reference to FIG. 5 according to certain aspects. FIG. 5 is a timing diagram showing an example of the test clock signal (labeled "Clk"), the reference signal (labeled "Ref"), and the output signal (labeled "Q") of the flop 430. In the example in FIG. 5, the flop 430 is implemented with a positive-edge-triggered flop. However, it is to be appreciated that the present disclosure is not limited to this example, as discussed below.

In the example in FIG. 5, the rising edge of the reference signal sweeps across the high phase of the test clock signal in which the rising edge of the reference signal shifts by ΔT relative to the test clock signal for each period of the reference clock signal, where ΔT is the difference between the period of the test clock signal (labeled "Tclk") and the period of the reference signal (labeled "$T_{ref}$"). As shown in FIG. 5, while the rising edge of the reference signal sweeps across the high phase of the test clock signal, the output signal (labeled "Q") of the flop 430 is high.

In the example in FIG. 5, the first counter 440 counts the number of periods of the reference clock signal in which the output signal of the flop 430 is high resulting in a count value of M. Thus, in this example it takes M periods of the reference signal for the rising edge of the reference signal to sweep across the high phase of the test clock signal. Since the rising edge of the reference signal shifts by ΔT relative to the test clock signal for each period of the reference clock signal, the rising edge of the reference signal shifts by M·ΔT to sweep across the high phase of the test clock signal. Thus, the high phase of the test clock signal is approximately equal to M·ΔT. Therefore, the count value M from the first counter 440 provides a measure of the high phase of the test clock signal. As discussed above, the high phase is the time duration that the test clock signal is high during each period of the test clock signal. The resolution of the high phase measurement depends on the size of the shift ΔT. The smaller the shift ΔT, the higher the resolution. A small shift ΔT is achieved by making the frequency of the test clock signal close to the frequency of the reference signal.

In the example in FIG. 5, the rising edge of the reference signal also sweeps across the low phase of the test clock signal in which the rising edge of the reference signal shifts by ΔT relative to the test clock signal for each period of the reference clock signal. As shown in FIG. 5, while the rising edge of the reference signal sweeps across the low phase of the test clock signal, the output signal (labeled "Q") of the flop 430 is low.

In the example in FIG. 5, the second counter 450 counts the number of periods of the reference clock signal in which the output signal of the flop 430 is low resulting in a count value of N. Thus, in this example it takes N periods of the reference clock signal for the rising edge of the reference clock signal to sweep across the low phase of the test clock signal. Since the rising edge of the reference signal shifts by ΔT relative to the test clock signal for each period of the reference clock signal, the rising edge of the reference signal shifts by N·ΔT to sweep across the low phase of the test clock signal. Thus, the low phase of the test clock signal is approximately equal to N·ΔT. Therefore, the count value N from the second counter 450 provides a measure of the low phase of the test clock signal. As discussed above, the low phase is the time duration that the test clock signal is low during each period of the test clock signal. The resolution of the low phase measurement depends on the size of the shift ΔT. The smaller the shift ΔT, the higher the resolution. A small shift ΔT is achieved by making the frequency of the test clock signal close to the frequency of the reference signal.

In the example in FIG. 5, the flop 430 is implemented with a positive-edge-triggered flop. However, it is to be appreciated that the present disclosure is not limited to this example. In another example, the flop 430 may be implemented with a negative-edge-triggered flop. In this example, the first counter 440 provides the M count value by counting the number of periods of the reference signal it takes for the falling edge of the reference signal to sweep across the high phase of the test clock signal. Also, in this example, the second counter 450 provides the N count value by counting the number of periods of the reference signal it takes for the falling edge of the reference signal to sweep across the low phase of the test clock signal. Thus, flop 430 may be positive-edge triggered or negative-edge triggered.

The count value M from the first counter 440 and the count value N from the second counter 450 may be used to determine the duty cycle of the test clock signal. The duty cycle of the test clock signal is given by:

$$\text{Duty Cycle} = \frac{T_H}{T_H + T_L} \quad (1)$$

where $T_H$ is the high phase of the test clock signal and $T_L$ is the low phase of the test clock signal. Plugging in M·ΔT for the high phase and N·ΔT for the low phase in equation (1) results in:

$$\text{Duty Cycle} = \frac{M \cdot \Delta T}{M \cdot \Delta T + N \cdot \Delta T} \quad (2)$$

which can be simplified by cancelling out ΔT to the following:

$$\text{Duty Cycle} = \frac{M}{M + N}. \quad (3)$$

Thus, the count value M from the first counter 440 and the count value N from the second counter 450 allow the duty cycle of the test clock signal to be determined. In certain aspects, the duty-cycle shift of the test clock signal may be given by:

$$\text{Duty Cycle Shift} = \frac{M}{M + N} - DC_{target} \quad (4)$$

where $DC_{target}$ is a target duty cycle (e.g., 0.5). In these aspects, the target duty cycle may be the desired duty cycle at the output of the clock path 120.

In certain aspects, the readout circuit 460 is configured to receive the count value M from the first counter 440 and the count value N from the second counter 450 via the inputs 462 and 464, and output the count values M and N to the control circuit 330 via the output 424. The control circuit 330 may use the count values M and N to estimate the duty-shift caused by the clock path 120 and determine a correction for the duty-cycle shift. Since the test clock signal propagates through the clock path 120 to reach the duty-cycle monitor 420, the duty cycle of the test clock signal is shifted by the clock path 120 before reaching the duty-cycle monitor 420. Thus, the duty cycle of the test clock signal, as measured using the count values M and N, allows the control circuit 330 to determine an appropriate correction for duty-cycle shift caused by the clock path 120 (e.g., based on equation (3) or (4)). The control circuit 330 may then generate a control signal based on the determined duty-cycle correction, and output the control signal to the control input 346 of the duty-cycle adjuster 340 to perform the correction. As discussed above, the duty-cycle adjuster 340 corrects for the duty-cycle shift caused by the clock path 120 by shifting the duty cycle of the clock signal in a direction that compensates for the duty-cycle shift caused by the clock path 120. For example, the control circuit 330 may estimate the duty-cycle shift caused by the clock path 120 using the count values M and N (e.g., based on equation (4)), and generate a control signal that causes the duty-cycle adjuster 340 to apply the opposite duty-cycle shift on the clock signal to correct for the duty-cycle shift caused by the clock path 120.

The duty-cycle monitor 420 has one or more advantages. For example, the duty-cycle monitor 420 does not require recording a count value before aging, and therefore eliminates the need for memory (e.g., Efuse memory) to store the count value before aging. Also, the duty-cycle monitor 420 does not require that the frequency of the test clock signal or the frequency of the reference signal be accurately known to calculate the duty cycle of the test clock signal. For example, as shown in equation (3), the duty cycle may be determined from the count value M and the count value N from the counters 440 and 450.

In certain aspects, the first oscillator 425 and the second oscillator 465 are implemented with similar structures and integrated on the same chip. For example, each of the first oscillator 425 and the second oscillator 465 may be implemented with a ring oscillator, a PLL, etc. Since the first oscillator 425 and the second oscillator 465 have similar structures and are integrated on the same chip in this example, the frequency of the test clock signal and the frequency of the reference signal are affected in a similar manner across process corners. In other words, the frequency of the reference signal tracks changes in the frequency of the test clock signal due to process variation. This allows the frequency of the reference signal to stay close to the frequency of the test clock signal across process corners to keep $\Delta T$ small and maintain the high resolution of the duty-cycle monitor 420 across process corners.

Figure 4B:
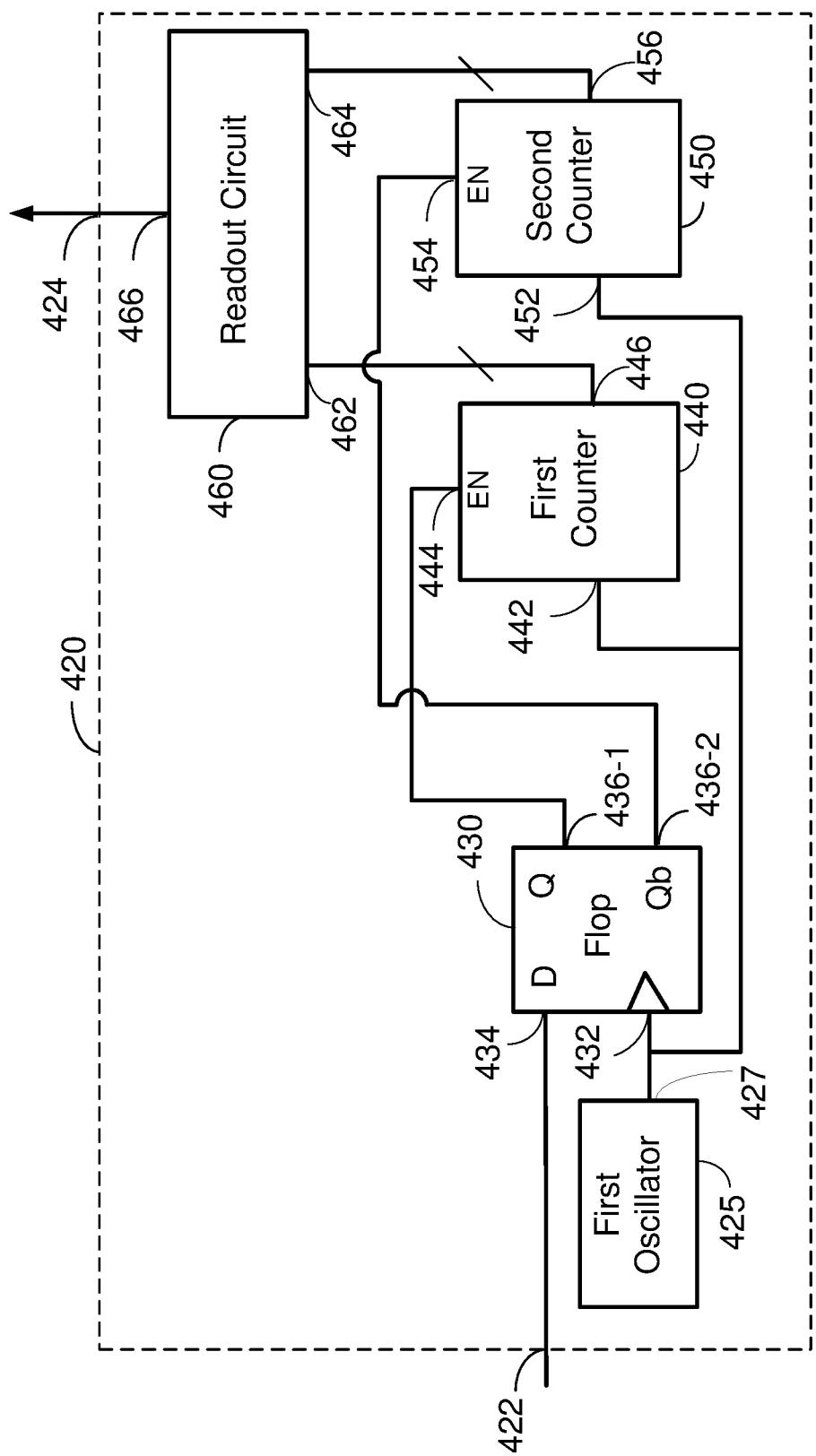
FIG. 4B shows another example of a duty-cycle monitor according to certain aspects of the present disclosure.

FIG. 4B shows another exemplary implementation for generating the count value N according to certain aspects. In this example, the output 436 in FIG. 4A includes a first output 436-1 and a second output 436-2, in which the first output 436-1 (labeled "Q") is coupled to the enable input 444 of the first counter 440 and the second output 436-2 (labeled "Qb") is coupled to the enable input 454 of the second counter 450. The flop 430 outputs the output signal discussed above at the first output 436-1, and outputs the inverse (i.e., complement) of the output signal at the second output 436-2 (i.e., the outputs 436-1 and 436-2 are complementary). In this example, the enable input 444 of the first counter 440 receives the output signal discussed above, and operates in the same manner discussed above with reference to FIG. 4A.

The enable input 454 of the second counter 450 receives the inverse output signal. In this example, the second counter 450 is configured to count the periods of the reference signal while the inverse output signal is high to generate the count value N. Since the inverse output signal (labeled "Qb") is high when the output signal (labeled "Q") is low, this is equivalent to counting the periods of the reference signal while the output signal (labeled "Q") is low to generate the count value N. Thus, the count value N in this example is the same as the count value N in the example in FIG. 4A. This is illustrated in FIG. 5, which shows that counting the number of periods of the reference signal when the inverse output signal (labeled "Qb") is high is equivalent to counting the number of periods of the reference signal when the output signal (labeled "Q") is low.

It is to be appreciated that in an alternative implementation, the first counter 440 and the second counter 450 in FIG. 4B may each be enabled when the respective enable input 444 and 454 is low instead of high. In this case, the first counter 440 may generate the count value N and the second counter 450 may generate the count value M. Thus, it is to be appreciated that the present disclosure is not limited to a particular implementation of the flop 430 and the counters 440 and 450 for generating the count values N and M.

Figure 6:
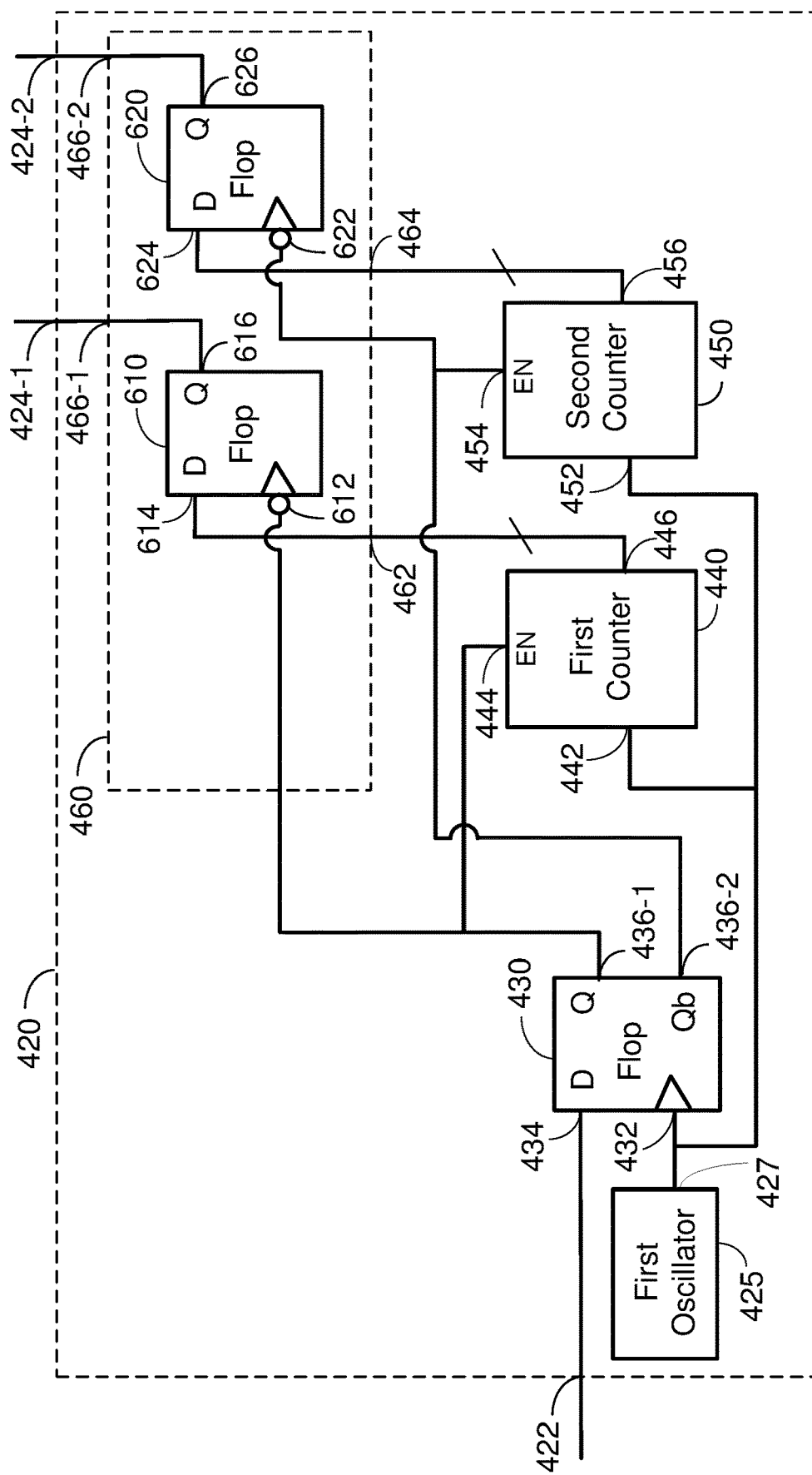
FIG. 6 shows an exemplary implementation of a readout circuit according to certain aspects of the present disclosure.

FIG. 6 shows an exemplary implementation of the readout circuit 460 according to certain aspects. In this example, the readout circuit 460 includes a first readout latch 610 and a second readout latch 620. Also, in this example, the readout circuit 460 has a first output 466-1 coupled to a first output 424-1 of the duty-cycle monitor 420, and a second output 466-2 coupled to a second output 424-2 of the duty-cycle monitor 420. The outputs 424-2 and 424-2 are coupled to the input 332 of the control circuit 330. As discussed further below, the count value M is output to the control circuit 330 from the first output 424-1 and the count value N is output to the control circuit 330 from the second output 424-2. Each of the readout latches 610 and 620 may be implemented with a D flip-flop, or another type of latch.

The first readout latch 610 has a data input 614, a clock input 612, and an output 616. The data input 614 is coupled to the output 446 of the first counter 440 to receive the count value M. In certain aspects, the count value M is multiple bits and the first readout latch 610 is a multi-bit latch (i.e., a latch capable of latching a multi-bit value). The clock input 612 of the first readout latch 610 is coupled to the first output 436-1 of the flop 430 to receive the output signal (labeled "Q") of the flop 430.

In operation, the first readout latch 610 is configured to latch the count value M from the output 446 of the first counter 440 on a falling edge 510 of the output signal (labeled "Q") from the flop 430, as example of which is shown in FIG. 5. As shown in FIG. 5, the falling edge 510 of the output signal occurs when the output signal transitions from high to low. Thus, the latched count value M indicates the number of reference periods counted by the first counter 440 during the time that the output signal was high. The first readout latch 610 outputs the latched count value M to the control circuit 330 via the first output 466-1.

The second readout latch 620 has a data input 624, a clock input 622, and an output 626. The data input 624 is coupled to the output 456 of the second counter 450 to receive the count value N. In certain aspects, the count value N is multiple bits and the second readout latch 620 is a multi-bit latch. The clock input 622 of the second readout latch 620 is coupled to the second output 436-2 of the flop 430 to receive the inverse output signal (labeled "Qb") of the flop 430.

In operation, the second readout latch 620 is configured to latch the count value N from the output 456 of the second counter 450 on a falling edge 520 of the inverse output signal (labeled "Qb") from the flop 430, as example of which is shown in FIG. 5. The second readout latch 620 outputs the latched count value N to the control circuit 330 via the second output 466-2.

In the example in FIG. 6, each of the first readout latch 610 and the second readout latch 620 is a falling-edge triggered latch (also referred to as a negative-edge triggered latch). However, it is to be appreciated that the present disclosure is not limited to this example.

Figure 7:
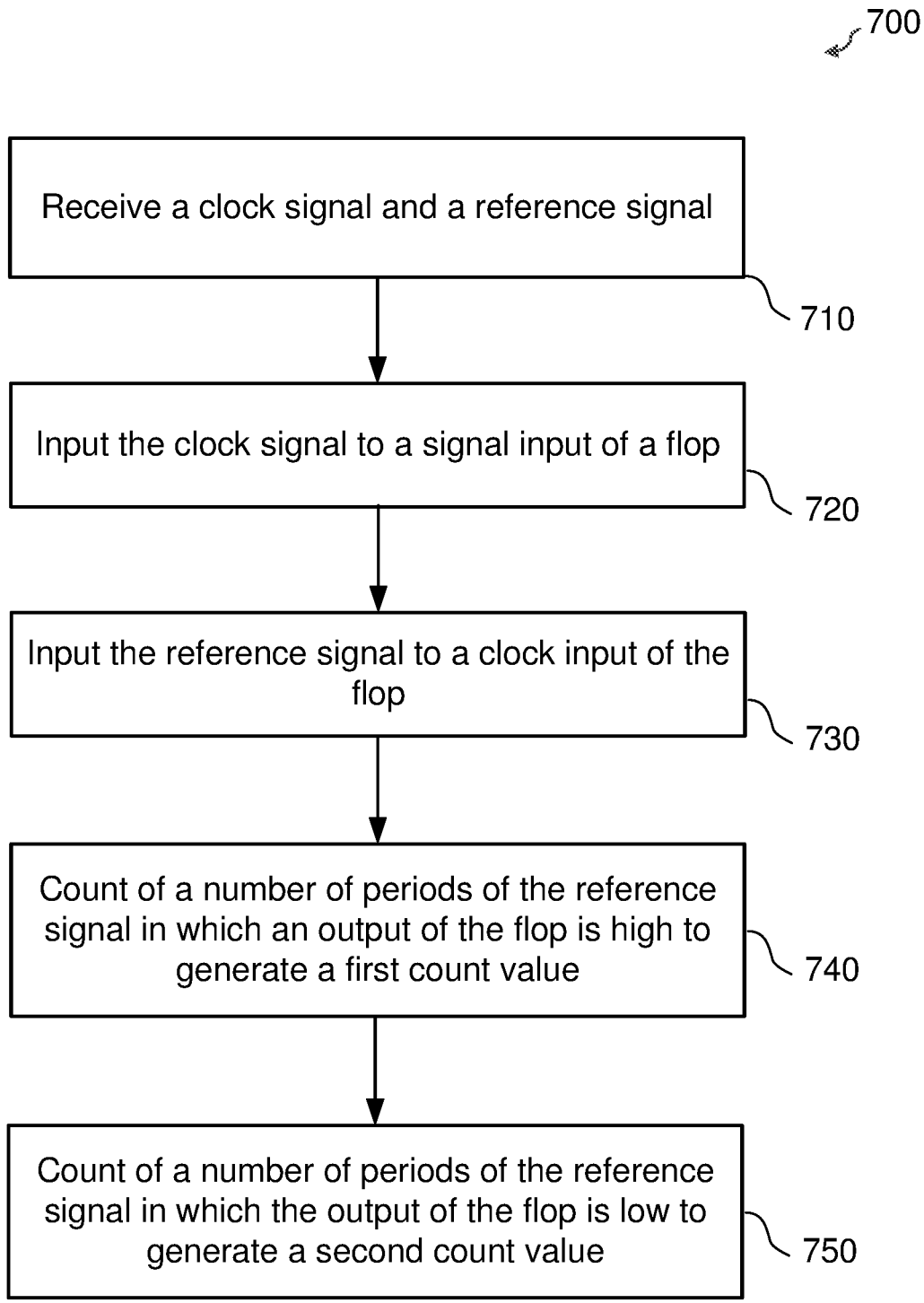
FIG. 7 is a flowchart illustrating a method of duty-cycle monitoring according to certain aspects of the present disclosure.

FIG. 7 illustrates a method 700 of duty-cycle monitoring according to certain aspects.

At block 710, a clock signal and a reference signal are received. For example, the clock signal may correspond to the test clock signal from the second oscillator 465, and the reference signal may correspond to the reference signal from the first oscillator 425. In certain aspects, the reference signal is an oscillating signal, and a frequency of the clock signal is within 5 percent of a frequency of the reference signal.

At block 720, the clock signal is input to a signal input of a flop. For example, the clock signal may be input to the signal input 434 of the flop 430. The signal input 434 may also be referred to as a D input.

At block 730, the reference signal is input to a clock input of the flop. For example, the reference signal may be input to the clock input 432 of the flop 430.

At block 740, a number of periods of the reference signal in which an output of the flop is high is counted to generate a first count value. For example, the number of periods of the reference signal in which the output of the flop is high may be counted by the first counter 440. The first count value may correspond to the count value M. The output of the flop may correspond to the output 436 of the flop 430.

At block 750, a number of periods of the reference signal in which an output of the flop is low is counted to generate a second count value. For example, the number of periods of the reference signal in which the output of the flop is low may be counted by the second counter 450. The second count value may correspond to the count value N.

In certain aspects, a duty cycle of the clock signal is determined based on the first count value and the second count value. For example, the control circuit 330 may determine the duty cycle based on equation (3).

In certain aspects, a duty-cycle shift of a duty-cycle adjuster may be controlled based on the determined duty cycle. For example, the duty-cycle adjuster may correspond to duty-cycle adjuster 340, and the duty-cycle shift of the duty-cycle adjuster may be controlled by the control circuit 330 based on the determined duty cycle.

In certain aspects, the output of the flop includes a first output and a second output, wherein the first output and the second output are complementary. For example, the first output may correspond to the first output 436-1 and the second output may correspond to the second output 436-2. In these aspects, counting the number of the periods of the reference signal in which the output of the flop is high may include counting the number of the periods of the reference signal in which the first output of the flop is high or low, and counting the number of the periods of the reference signal in which the output of the flop is low may include counting the number of the periods of the reference signal in which the second output of the flop is high or low.

It is to be appreciated that an output disclosed herein may include a single output or multiple parallel outputs. For example, the count output 446 and 456 of each of the counters 440 and 450 may include a single serial output or multiple parallel outputs (e.g., for outputting the bits of the respective count value in parallel). Similarly, an input disclosed herein may include a single input or multiple parallel inputs.

The control circuit 330 may be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Implementation examples are described in the following numbered clauses:

1. A system, comprising:
   a duty-cycle monitor, comprising:
   a first oscillator having an output;
   a flop having a signal input, a clock input, and an output, wherein the signal input is coupled to an input of the duty-cycle monitor, and the clock input is coupled to the output of the first oscillator;
   a first counter having a count input, an enable input, and a count output, wherein the count input of the first counter is coupled to the output of the first oscillator, and the enable input of the first counter is coupled to the output of the flop; and
   a second counter having a count input, an enable input, and a count output, wherein the count input of the second counter is coupled to the output of the first oscillator, and the enable input of the second counter is coupled to the output of the flop.

2. The system of clause 1, wherein:
   the first counter is enabled when the enable input of the first counter is high; and
   the second counter is enabled when the enable input of the second counter is low.

3. The system of clause 1, wherein:
   the output of the flop comprises a first output and a second output, wherein the first output and the second output are complementary;
   the enable input of the first counter is coupled to the first output of the flop; and
   the enable input of the second counter is coupled to the second output of the flop.

4. The system of clause 3, wherein:
   the first counter is enabled when the enable input of the first counter is high; and
   the second counter is enabled when the enable input of the second counter is high.

5. The system of clause 3, wherein:
   the first counter is enabled when the enable input of the first counter is low; and
   the second counter is enabled when the enable input of the second counter is low.

6. The system of any one of clauses 1 to 5, wherein the duty-cycle monitor further comprises a readout circuit coupled to the count output of the first counter and the count output of the second counter.

7. The system of clause 6, wherein the readout circuit comprises:
   a first readout latch having a data input, a clock input, and an output, wherein the data input of the first readout latch is coupled to the count output of the first counter, the clock input of the first readout latch is coupled to the output of the flop, and the output of the first readout latch is coupled to a first output of the duty-cycle monitor; and
   a second readout latch having a data input, a clock input, and an output, wherein the data input of the second readout latch is coupled to the count output of the second counter, the clock input of the second readout latch is coupled to the output of the flop, and the output of the second readout latch is coupled to a second output of the duty-cycle monitor.

8. The system of clause 7, wherein:
the output of the flop comprises a first output and a second output, wherein the first output and the second output are complementary;
the clock input of the first readout latch is coupled to the first output of the flop; and
the clock input of the second readout latch is coupled to the second output of the flop.

9. The system of any one of clauses 1 to 8, further comprising:
a second oscillator having an output; and
a clock path coupled between the output of the second oscillator and the input of the duty-cycle monitor.

10. The system of clause 9, wherein the clock path comprises clock buffers coupled in series.

11. The system of clause 9 or 10, wherein a frequency of the second oscillator is within 5 percent of a frequency of the first oscillator.

12. The system of any one of clauses 9 to 11, further comprising a duty-cycle adjuster coupled between the output of the second oscillator and the clock path.

13. The system of clause 12, further comprising a control circuit coupled between the duty-cycle monitor and the duty-cycle adjuster.

14. The system of any one of clauses 1 to 8, further comprising:
a second oscillator having an output;
a clock generator;
a first select circuit having a first input, a second input, and an output, wherein the first input is coupled to the output of the second oscillator, and the second input is coupled to the clock generator;
a second select circuit having an input, a first output, and a second output, wherein the first output is coupled to the input of the duty-cycle monitor, and the second output is coupled to at least one of sequential logic, a processor, and a memory; and
a clock path coupled between the output of the first select circuit and the input of the second select circuit.

15. The system of clause 14, wherein a frequency of the second oscillator is within 5 percent of a frequency of the first oscillator.

16. The system of clause 14 or 15, further comprising a duty-cycle adjuster coupled between the output of the first select circuit and the clock path.

17. The system of clause 16, further comprising a control circuit coupled between the duty-cycle monitor and the duty-cycle adjuster.

18. The system of any one of clauses 14 to 17, wherein:
in a first mode, the first select circuit is configured to select the first input and the second select circuit is configured to select the first output; and
in a second mode, the first select circuit is configured to select the second input and the second select circuit is configured to select the second output.

19. A method of duty-cycle monitoring, comprising:
receiving a clock signal and a reference signal;
inputting the clock signal to a signal input of a flop;
inputting the reference signal to a clock input of the flop;
counting a number of periods of the reference signal in which an output of the flop is high to generate a first count value; and
counting a number of periods of the reference signal in which the output of the flop is low to generate a second count value.

20. The method of clause 19, wherein the reference signal is an oscillating signal, and a frequency of the clock signal is within 5 percent of a frequency of the reference signal.

21. The method of clause 19 or 20, further comprising determining a duty cycle of the clock signal based on the first count value and the second count value.

22. The method of clause 21, further comprising controlling a duty-cycle shift of a duty-cycle adjuster based on the determined duty cycle.

23. The method of clause 22, wherein:
receiving the clock signal comprises receiving the clock signal from an output of a clock path; and
the duty-cycle adjuster is coupled to an input of the clock path.

24. The method of any one of clauses 19 to 23, wherein:
the output of the flop comprises a first output and a second output;
the first output and the second output are complementary;
counting the number of the periods of the reference signal in which the output of the flop is high comprises counting the number of the periods of the reference signal in which the first output of the flop is high or low; and
counting the number of the periods of the reference signal in which the output of the flop is low comprises counting the number of the periods of the reference signal in which the second output of the flop is high or low.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:
1. A system, comprising:
a duty-cycle monitor, comprising:
a first oscillator having an output;
a flop having a signal input, a clock input, and an output, wherein the signal input is coupled to an input of the duty-cycle monitor, and the clock input is coupled to the output of the first oscillator;
a first counter having a count input, an enable input, and a count output, wherein the count input of the first counter is coupled to the output of the first oscillator, and the enable input of the first counter is coupled to the output of the flop; and
a second counter having a count input, an enable input, and a count output, wherein the count input of the second counter is coupled to the output of the first oscillator, and the enable input of the second counter is coupled to the output of the flop.

2. The system of claim 1, wherein:
the first counter is enabled when the enable input of the first counter is high; and
the second counter is enabled when the enable input of the second counter is low.

3. The system of claim 1, wherein:
the output of the flop comprises a first output and a second output, wherein the first output and the second output are complementary;
the enable input of the first counter is coupled to the first output of the flop; and
the enable input of the second counter is coupled to the second output of the flop.

4. The system of claim 3, wherein:
the first counter is enabled when the enable input of the first counter is high; and
the second counter is enabled when the enable input of the second counter is high.

5. The system of claim 3, wherein:
the first counter is enabled when the enable input of the first counter is low; and
the second counter is enabled when the enable input of the second counter is low.

6. The system of claim 1, wherein the duty-cycle monitor further comprises a readout circuit coupled to the count output of the first counter and the count output of the second counter.

7. The system of claim 6, wherein the readout circuit comprises:
a first readout latch having a data input, a clock input, and an output, wherein the data input of the first readout latch is coupled to the count output of the first counter, the clock input of the first readout latch is coupled to the output of the flop, and the output of the first readout latch is coupled to a first output of the duty-cycle monitor; and
a second readout latch having a data input, a clock input, and an output, wherein the data input of the second readout latch is coupled to the count output of the second counter, the clock input of the second readout latch is coupled to the output of the flop, and the output of the second readout latch is coupled to a second output of the duty-cycle monitor.

8. The system of claim 7, wherein:
the output of the flop comprises a first output and a second output, wherein the first output and the second output are complementary;
the clock input of the first readout latch is coupled to the first output of the flop; and
the clock input of the second readout latch is coupled to the second output of the flop.

9. The system of claim 1, further comprising:
a second oscillator having an output; and
a clock path coupled between the output of the second oscillator and the input of the duty-cycle monitor.

10. The system of claim 9, wherein the clock path comprises clock buffers coupled in series.

11. The system of claim 9, wherein a frequency of the second oscillator is within 5 percent of a frequency of the first oscillator.

12. The system of claim 9, further comprising a duty-cycle adjuster coupled between the output of the second oscillator and the clock path.

13. The system of claim 12, further comprising a control circuit coupled between the duty-cycle monitor and the duty-cycle adjuster.

14. The system of claim 1, further comprising:
a second oscillator having an output;
a clock generator;
a first select circuit having a first input, a second input, and an output, wherein the first input is coupled to the output of the second oscillator, and the second input is coupled to the clock generator;
a second select circuit having an input, a first output, and a second output, wherein the first output is coupled to the input of the duty-cycle monitor, and the second output is coupled to at least one of sequential logic, a processor, and a memory; and
a clock path coupled between the output of the first select circuit and the input of the second select circuit.

15. The system of claim 14, wherein a frequency of the second oscillator is within 5 percent of a frequency of the first oscillator.

16. The system of claim 14, further comprising a duty-cycle adjuster coupled between the output of the first select circuit and the clock path.

17. The system of claim 16, further comprising a control circuit coupled between the duty-cycle monitor and the duty-cycle adjuster.

18. The system of claim 14, wherein:
in a first mode, the first select circuit is configured to select the first input and the second select circuit is configured to select the first output; and
in a second mode, the first select circuit is configured to select the second input and the second select circuit is configured to select the second output.

19. A method of duty-cycle monitoring, comprising:
receiving a clock signal and a reference signal;
inputting the clock signal to a signal input of a flop;
inputting the reference signal to a clock input of the flop;
counting a number of periods of the reference signal in which an output of the flop is high to generate a first count value; and
counting a number of periods of the reference signal in which the output of the flop is low to generate a second count value.

20. The method of claim 19, wherein the reference signal is an oscillating signal, and a frequency of the clock signal is within 5 percent of a frequency of the reference signal.

21. The method of claim 19, further comprising determining a duty cycle of the clock signal based on the first count value and the second count value.

22. The method of claim 21, further comprising controlling a duty-cycle shift of a duty-cycle adjuster based on the determined duty cycle.

23. The method of claim 22, wherein:
receiving the clock signal comprises receiving the clock signal from an output of a clock path; and
the duty-cycle adjuster is coupled to an input of the clock path.

24. The method of claim 19, wherein:
the output of the flop comprises a first output and a second output;
the first output and the second output are complementary;
counting the number of the periods of the reference signal in which the output of the flop is high comprises counting the number of the periods of the reference signal in which the first output of the flop is high or low; and
counting the number of the periods of the reference signal in which the output of the flop is low comprises counting the number of the periods of the reference signal in which the second output of the flop is high or low.

\* \* \* \* \*